(12) United States Patent
Takeda et al.

(10) Patent No.: US 8,465,993 B2
(45) Date of Patent: Jun. 18, 2013

(54) VERTICAL CAVITY SURFACE EMITTING LASER, VERTICAL CAVITY SURFACE EMITTING LASER DEVICE, OPTICAL TRANSMISSION DEVICE, AND INFORMATION PROCESSING APPARATUS

(71) Applicants: Kazutaka Takeda, Kanagawa (JP);
Masahiro Yoshikawa, Kanagawa (JP);
Kazuyuki Matsushita, Kanagawa (JP)

(72) Inventors: Kazutaka Takeda, Kanagawa (JP);
Masahiro Yoshikawa, Kanagawa (JP);
Kazuyuki Matsushita, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 13/650,410

(22) Filed: Oct. 12, 2012

(65) Prior Publication Data

US 2013/0034922 A1    Feb. 7, 2013

Related U.S. Application Data

(62) Division of application No. 12/781,175, filed on May 17, 2010, now abandoned.

(30) Foreign Application Priority Data

Dec. 9, 2009  (JP) ................................. 2009-279328

(51) Int. Cl.
*H01L 33/10*  (2010.01)
(52) U.S. Cl.
USPC ..................................... 438/31; 257/E33.069
(58) Field of Classification Search
None
See application file for complete search history.

(56) References Cited

U.S. PATENT DOCUMENTS

| 6,320,891 | B1 * | 11/2001 | Seko ........................... 372/50.21 |
| 8,059,689 | B2 * | 11/2011 | Sakurai et al. .............. 372/46.01 |
| 2002/0093024 | A1 * | 7/2002 | Lee et al. ......................... 257/98 |
| 2008/0031301 | A1 | 2/2008 | Mochizuki |
| 2009/0097517 | A1 | 4/2009 | Sakamoto et al. |
| 2009/0274186 | A1 | 11/2009 | Mochizuki |
| 2011/0058587 | A1 * | 3/2011 | Sakurai et al. .............. 372/46.01 |

FOREIGN PATENT DOCUMENTS

| JP | 2001-156395 | 6/2001 |
| JP | 2004-063657 | 2/2004 |
| JP | 2006-210429 | 8/2006 |
| JP | 2008-041777 | 2/2008 |

* cited by examiner

*Primary Examiner* — Seahvosh Nikmanesh
(74) *Attorney, Agent, or Firm* — Fildes & Outland, P.C.

(57) ABSTRACT

A vertical cavity surface emitting laser that includes: a substrate; a first semiconductor multilayer reflector; an active region; a second semiconductor multilayer reflector; a columnar structure formed from the second semiconductor multilayer reflector to the first semiconductor multilayer reflector; a current narrowing layer formed inside of the columnar structure and having a conductive region surrounded by an oxidization region; a first electrode formed at a top of the columnar structure, electrically connected to the second semiconductor multilayer reflector and defining a beam window; a first insulating film comprised of a material with a first refractive index and formed on the first electrode to cover the beam window; and a second insulating film comprised of a material with a second refractive index and formed on the first insulating film, of which a radius is smaller than a radius of the conductive region.

5 Claims, 11 Drawing Sheets

FIG. 3

| FIRST INSULATING FILM | SECOND INSULATING FILM |
|---|---|
| SiON | $TiO_2$ |
| $SiO_2$ | $TiO_2$ |
| $SiO_2$ | SiN |
| SiN | $TiO_2$ |

US 8,465,993 B2

VERTICAL CAVITY SURFACE EMITTING LASER, VERTICAL CAVITY SURFACE EMITTING LASER DEVICE, OPTICAL TRANSMISSION DEVICE, AND INFORMATION PROCESSING APPARATUS

CROSS-REFERENCE TO RELATED APPLICATION

This application is a divisional of U.S. patent application Ser. No. 12/781,175 filed May 17, 2010 which is based on and claims priority under 35 USC 119 from Japanese Patent Application No. 2009-279328 filed on Dec. 9, 2009.

BACKGROUND (i) Technical Field

The present invention relates to a vertical cavity surface emitting laser, a vertical cavity surface emitting laser device, an optical transmission device, and an information processing apparatus.

(ii) Related Art

A vertical cavity surface emitting laser (VCSEL) is used as a light source in a communication device and an image forming apparatus. Single lateral mode, high power and long service life are required for such vertical cavity surface emitting laser used as a light source. In an exemplary selective oxidation type vertical cavity surface emitting laser, a single lateral mode is achieved by reducing a radius of the oxidized aperture of a current narrowing layer to about 2 through 3 µm, but it becomes difficult to obtain an optical output greater than or equal to 3 mW stably.

SUMMARY

According to an aspect of the present invention, there is provided a vertical cavity surface emitting laser device including: a substrate; a first semiconductor multilayer reflector of a first conductive type formed on the substrate; an active region formed on the first semiconductor multilayer reflector; a second semiconductor multilayer reflector of a second conductive type formed on the active region; a columnar structure that is formed from the second semiconductor multilayer reflector to the first semiconductor multilayer reflector on the substrate; a current narrowing layer that is formed inside of the columnar structure, and has a conductive region surrounded by an oxidization region selectively oxidized; a first electrode that is annular, is formed at a top of the columnar structure, is electrically connected to the second semiconductor multilayer reflector, and defines a beam window; a first insulating film that is comprised of a material which has a first refractive index capable of transmitting an oscillation wavelength, and formed on the first electrode to cover the beam window; and a second insulating film that is circular, is comprised of a material which has a second refractive index that is able to transmit an oscillation wavelength and greater than the first refractive index, and is formed on the first insulating film, and of which a radius is smaller than a radius of the conductive region.

BRIEF DESCRIPTION OF THE DRAWINGS

Exemplary embodiments of the present invention will be described in detail based on the following figures, wherein:

FIG. 3 is a diagram illustrating exemplary combinations of a first insulating film and a second insulating film;

DETAILED DESCRIPTION

A description will now be given, with reference to the accompanying drawings, of exemplary embodiments of the present invention. In the following description, a selective oxidation type vertical cavity surface emitting laser will be exemplified, and a vertical cavity surface emitting laser is abbreviated as a VCSEL. The scale in drawings is exaggerated to understand the feature of the present invention, and is not same as the scale of actual devices.

First Exemplary Embodiment

Figure 1:
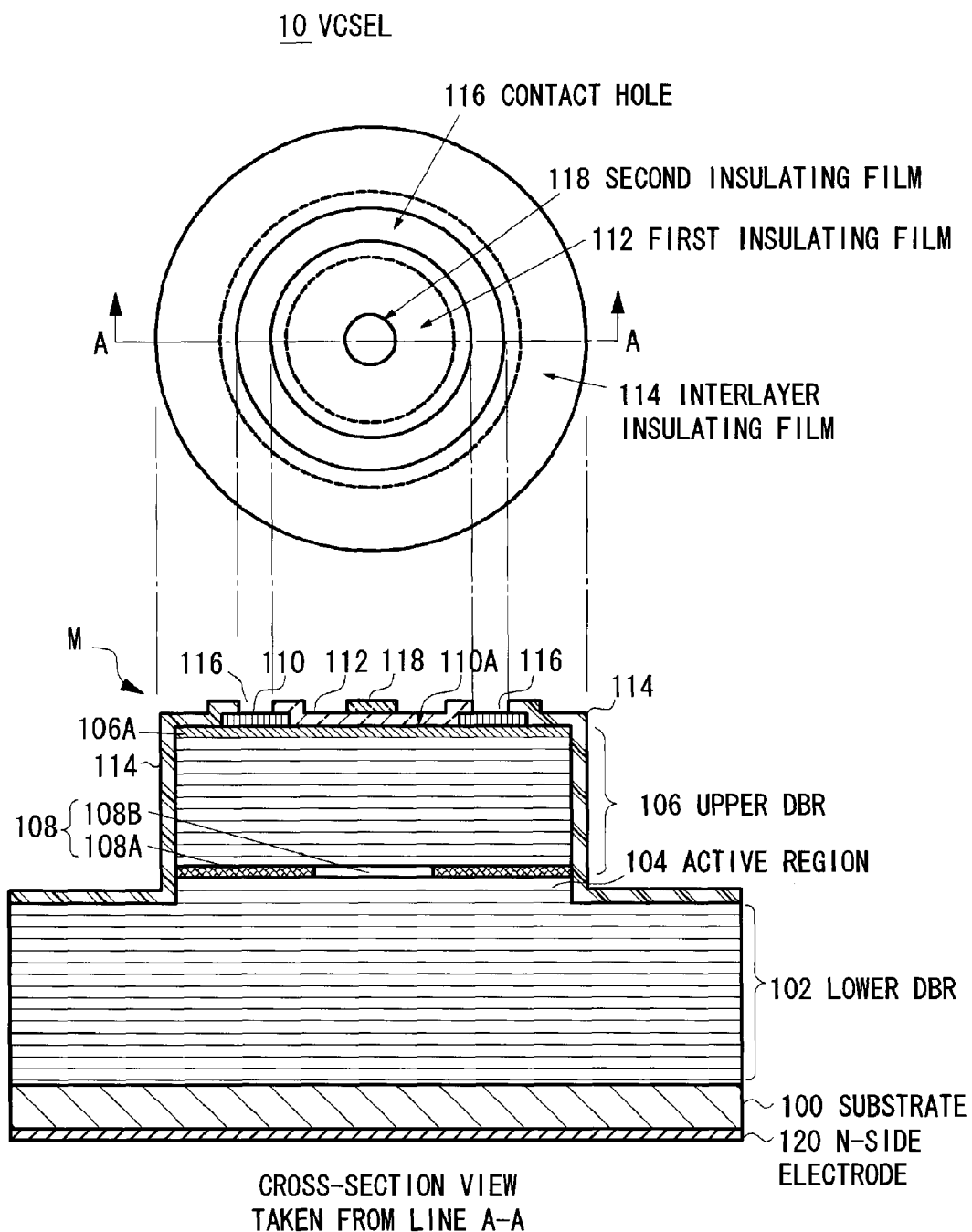
FIG. 1 illustrates a plane view, and a cross-section view taken from line A-A of a vertical cavity surface emitting laser in accordance with a first exemplary embodiment of the present invention.

FIG. 1 is a schematic cross-section view of a VCSEL in accordance with the first exemplary embodiment of the present invention. As illustrated in FIG. 1, a VCSEL 10 of the exemplary embodiment is formed by stacking an n-type lower Distributed Bragg Reflector (hereinafter, abbreviated as DBR) 102, an active region 104, and a p-type upper DBR 106 on an n-type GaAs substrate 100. The n-type lower DBR 102 is formed by stacking AlGaAs layers with different Al composition alternately. The active region 104 includes a quantum well layer sandwiched between upper and lower spacer layers. The p-type upper DBR 106 is formed by stacking AlGaAs layers with different Al composition on the active region 104 alternately.

The n-type lower DBR 102 is a multi-layer stack formed by a pair of an Al0.9Ga0.1As layer and an Al0.3Ga0.7As layer for example. The thickness of each layer is $\lambda/4n_r$ ($\lambda$ is an oscillation wavelength, and $n_r$ is a refractive index of the medium), and the $Al_{0.9}Ga_{0.1}As$ layer and the $Al_{0.3}Ga_{0.7}As$ layer are stacked alternately 40 periods. A carrier concentration after doping an n-type impurity (silicon) is $3\times10^{18}$ cm$^{-3}$ for example.

A lower spacer layer of the active region 104 is an undoped Al0.6Ga0.4As layer, quantum well active layers are an undoped Al0.11Ga0.89As quantum well layer and an undoped Al0.3Ga0.7As barrier layer, and an upper spacer layer is an undoped Al0.6Ga0.4As layer.

The p-type upper DBR 106 is a multi-layer stack formed by a pair of an Al0.9Ga0.1As layer and an Al0.3Ga0.7As layer for example. The thickness of each layer is $\lambda/4n_r$, and the $Al_{0.9}Ga_{0.1}As$ layer and the $Al_{0.3}Ga_{0.7}As$ layer are stacked alternately 24 periods. A carrier concentration after doping a p-type impurity (carbon) is $3\times10^{18}$ cm$^{-3}$ for example. A contact layer 106A comprised of p-type GaAs is formed at a top layer of the upper DBR 106, and a current narrowing layer 108 comprised of p-type AlAs is formed at a bottom layer of the upper DBR 106 or inside of the upper DBR 106.

A cylindrical mesa (a columnar structure) M is formed on the substrate 100 by etching a semiconductor layer from the upper DBR 106 to the lower DBR 102. The current narrowing layer 108 is exposed on the side surface of the mesa M, and has an oxidization region 108A which is selectively oxidized from the side surface, and a conductive region (oxidized aperture) 108B surrounded by the oxidization region 108A. In the oxidization process of the current narrowing layer 108, the oxidation rate of an AlAs layer is faster than that of an AlGaAs layer, and the oxidization proceeds from the side surface of the mesa M to the inside at an almost constant rate. Therefore, the planar shape of the surface, which is parallel to the principal surface of the substrate 100 of the conductive region 108B, becomes a round shape which reflects the outer shape of the mesa M, and the center of the conductive region 108B corresponds to the axial center of the mesa M which means an optical axis. The radius of the conductive region 110B may have the size at which the high-order lateral mode oscillation occurs. For example, the radius of the conductive region 110B may be equal to or larger than 5 μm in a wavelength range of 780 nm.

An annular metallic p-side electrode 110 is formed at the top layer of the mesa M. The p-side electrode 110 is comprised of a metal formed by stacking Au or Ti/Au for example, and is ohmic connected to the contact layer 106A of the upper DBR 106. The outside diameter of the p-side electrode 110 is larger than the radius of the conductive region 108B. The circular opening is formed at the center of the p-side electrode 110, and this opening defines a beam window 110A which emits a beam. The center of the beam window 110A corresponds to the optical axis of the mesa M, and the radius of the beam window 110A is larger than the radius of the conductive region 108B.

A circular first insulating film 112 is formed on the p-side electrode 110 to cover the beam window 110A. The first insulating film 112 is comprised of a material that is able to transmit the oscillation wavelength. The outside diameter of the first insulating film 112 is smaller than the outside diameter of the p-side electrode, and larger than the radius of the beam window 110A. Therefore, the beam window 110A is covered by the first insulating film 112 completely, but a part of the p-side electrode 110 is exposed by the first insulating film 112.

An interlayer insulating film 114 covering the edge of the bottom, side, and top of the mesa M is formed. The edge of the interlayer insulating film 114 covers the part of the p-side electrode 110, and a annular contact hole 116 which exposes the p-side electrode 110 is formed between the interlayer insulating film 114 and the first insulating film 112.

A circular second insulating film 118 comprised of a material that is able to transmit the oscillation wavelength is formed on the first insulating film 112. The center of the second insulating film 118 corresponds to the optical axis, and the outside diameter of the second insulating film 118 is smaller than the radius of the conductive region 108B. For example, when the radius of the conductive region 108B is about 5 μm, the radius of the second insulating film 118 is about 3 μm. In the preferable exemplary embodiment, the second insulating film 118 can be formed with the same process as that of the interlayer insulating film 114 by using the same material as that of the interlayer insulating film 114. An n-side electrode 120 that is electrically connected to the lower DBR 102 is formed on the back side of the substrate 100.

Figure 2:
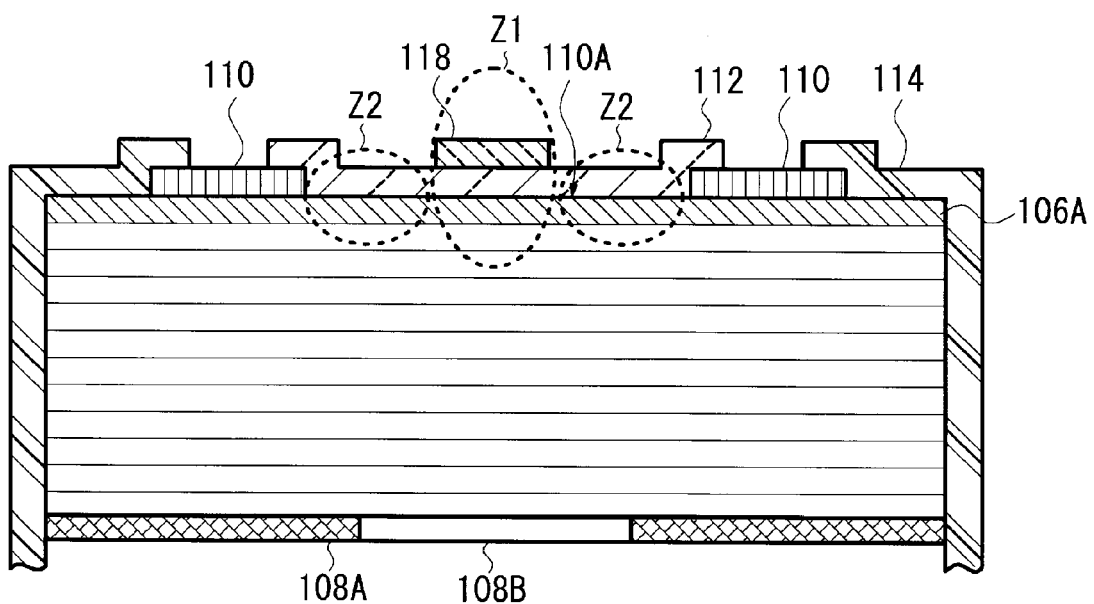
FIG. 2 is a cross-section view enlarging a top of a mesa of the vertical cavity surface emitting laser illustrated in FIG. 1.

FIG. 2 is an enlarged cross-section views of the top of the mesa of the VCSEL in FIG. 1. In the present exemplary embodiment, the refractive index of the first insulating film 112 is n1, the refractive index of the second insulating film 118 is n2, the refractive index of the semiconductor layer (the contact layer 106A) of the upper DBR 106 is n3. Then, the relation among n1, n2, and n3 is n1<n2<n3. Each film thickness of the first insulating film 112 and the second insulating film 118 is odd multiples of the wavelength of the medium $\lambda/4$, which means $(2n-1)\lambda/4$ (n is positive integer).

As illustrated in FIG. 2, there are a circular first region Z1 where the first insulating film 112 is formed and the second insulating film 118 is stacked on the first insulating film 112, and an annular second region X2 where only the first insulating film 112 is formed around the first region Z1, on the contact layer 106A exposed by the beam window 110A. The center of the first region Z1 corresponds to the center of the conductive region 110B (the optical axis), but the size of the first region Z1 is smaller than the radius of the conductive region 110B. As the second insulating film 118 of which the refractive index n2 is greater than the refractive index n1 of the first insulating film 112 is formed in the first region Z1, the reflection ratio r1 of the upper DBR 106 including the first region Z1 is higher than the reflection ratio r2 of the upper DBR 106 including the second region Z2. Therefore, a high-order lateral mode oscillation is suppressed in the upper DBR 106 including the second region Z2, and a fundamental transverse mode oscillation is accelerated in the upper DBR 106 including the first region Z1. Therefore, it is possible to increase the optical output by making the radius of the conductive region 108B (the radius of the oxidized aperture) be the size at which a high-order lateral mode oscillates.

Preferably, it is desirable to select a material that makes the difference between the refractive indexes n1 and n2 large. This makes it possible to make a difference of reflection ratio between the first region Z1 and the first region Z2 (r1–r2) large. For example, the first insulating film 112 may be comprised of SiON, and the second insulating film 118 may be comprised of SiN. In addition to this, the first insulating film 112 and the second insulating film 118 may be comprised of combinations indicated in FIG. 3. For example, when the first insulating film 112 is comprised of SiON, the second insulating film 118 may be comprised of TiO$_2$. When the first insulating film 112 is comprised of SiO$_2$, the second insulating film 118 may be comprised of SiN.

Figure 4A:
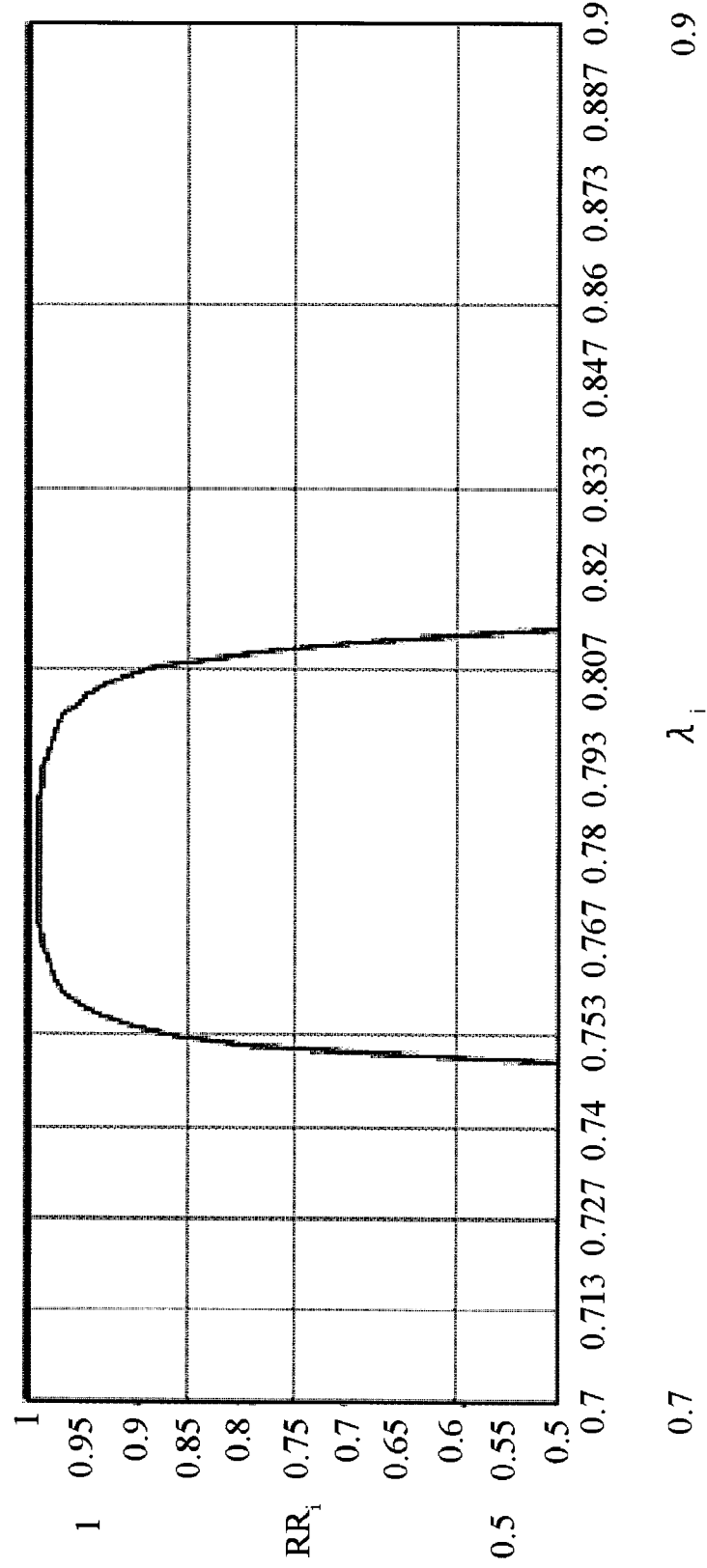
FIG. 4A is a diagram illustrating a simulation result of a reflection ratio of an upper DBR in a region where only a first insulating film exists.
Figure 4B:
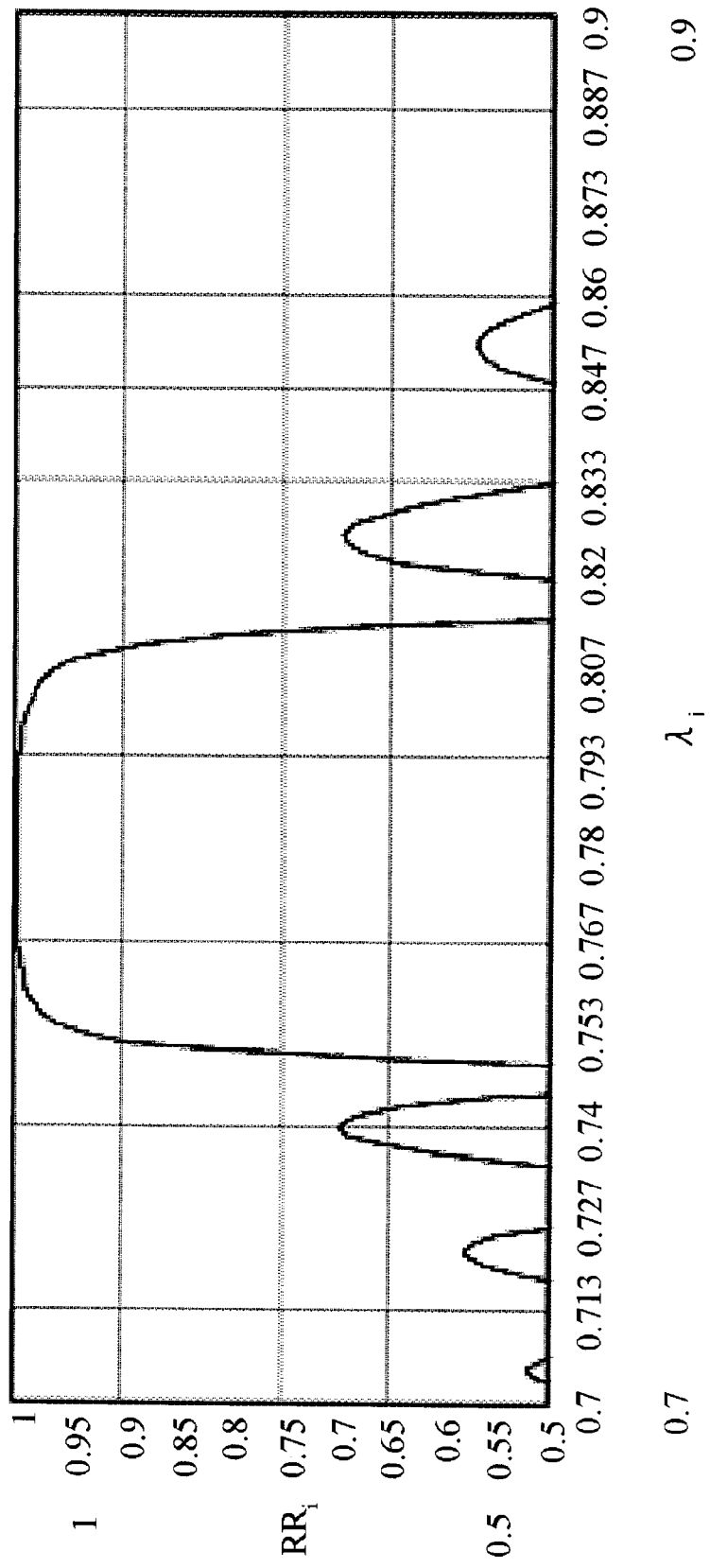
FIG. 4B is a diagram illustrating a simulation result of a reflection ratio of an upper DBR in a region where a first insulating film and a second insulating film are stacked.

A description will now be given of a simulation result of a reflection ratio of the upper DBR of the VCSEL of the present exemplary embodiment. Suppose that the upper DBR 106 is composed by stacking $Al_{0.9}Ga_{0.1}As$ layer and $Al_{0.3}Ga_{0.7}As$ layer 24 periods. FIG. 4A illustrates a reflection ratio r2 of the upper DBR including the second region Z2 when SiON with a film thickness of $\lambda/4$ is formed as the first insulating film 112. FIG. 4B illustrates a reflection ratio r1 of the upper DBR including the first region Z1 when SiON with a film thickness of λ/4 is formed as the first insulating film 112, and SiN with a film thickness of λ/4 is formed as the second insulating film 118. In the second region Z2 illustrated in FIG. 4A, the reflection ratio r2 is about 99.2% in a wavelength range of 780 nm. In the first region Z1 illustrated in FIG. 4B, the reflection ratio r1 is about 99.7% in a wavelength range of 780 nm. A reflection ratio needed for a laser oscillation typically is about 99.5%. Therefore, in the first region Z1, the fundamental lateral mode generated on the optical axis is easily oscillated, and in the second region Z2 the high-order lateral mode oscillation away from the optical axis is suppressed. The fundamental transverse mode oscillation is selectively accelerated and the high-order lateral mode oscillation is suppressed, by making the difference between reflection ratios r1 of the first region Z1 and r2 of the second region Z2. Ordinary skilled persons in the art can understand that it is possible to adjust reflection ratios r1 and r2 by selecting the periodic number of the upper DBR 106 and materials of first and second insulating films 112 and 118.

Second Exemplary Embodiment

Figure 5:
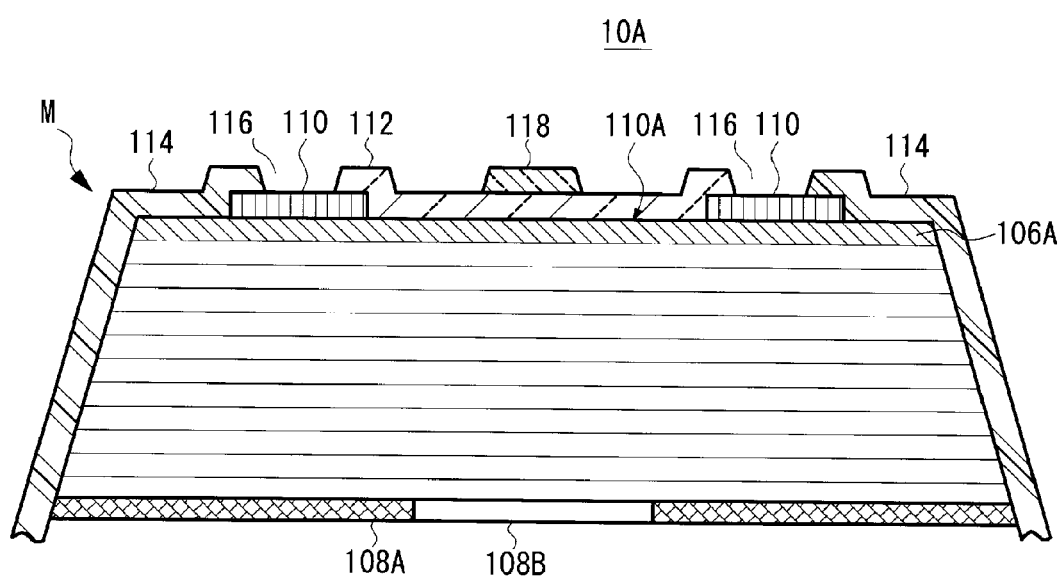
FIG. 5 is a cross-section view enlarging a top of a mesa of a vertical cavity surface emitting laser in accordance with a second exemplary embodiment of the present invention.

FIG. 5 is a cross-section view of a main part of a VCSEL in accordance with a second exemplary embodiment of the present invention. In a VCSEL 10A in accordance with the present exemplary embodiment, a taper is formed in the mesa M, and the radius of the mesa gradually narrows along to the top. Such taper of the mesa can be formed by selecting proper etching condition. In addition to the taper of the mesa M, the end surface of the first insulating film 112, the end surface of the interlayer insulating film 114, and the end surface of the second insulating film 118 are inclined in a tapered shape. By making the mesa M have a taper structure, the step coverage of the adherent interlayer insulating film 114 is improved, and it is possible to prevent the disconnection of the interlayer insulating film 114. In addition, it is possible to make the film thickness of the interlayer insulating film 114 that is formed on the side and top of the mesa M almost uniform. When the second insulating film 118 is formed with the same process as that of the interlayer insulating film 114, it is possible to uniformly-control both film thicknesses to be odd multiples of λ/4. Furthermore, it is possible to prevent the disconnection of metallic wiring that is coupled to the p-side electrode 110 through the contact hole 116.

Third Exemplary Embodiment

Figure 6A:
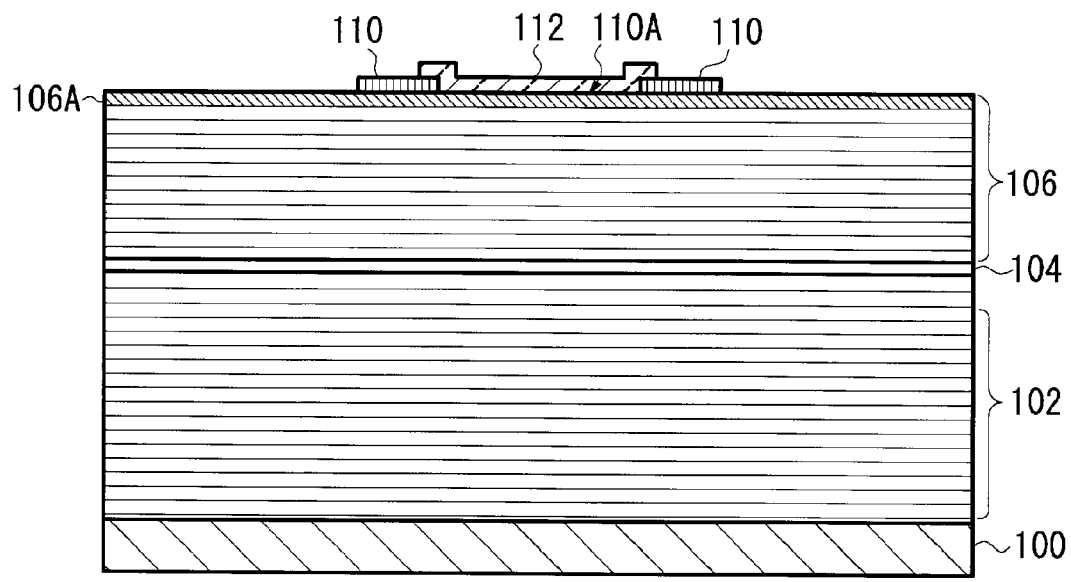
FIGS. 6A and 6B are cross-section views for explaining a fabrication process of a vertical cavity surface emitting laser in accordance with a third exemplary embodiment of the present invention.

A description will now be given of a third exemplary embodiment. The third exemplary embodiment relates to a preferable fabrication method of the VCSEL. A fabrication method is described with reference to FIGS. 6A through 7B. As illustrated in FIG. 6A, the n-type lower DBR 102, the active region 104, and the p-type upper DBR 106 are stacked on the n-type GaAs substrate 100 by the metal organic chemical vapor deposition (MOCVD) method. The n-type lower DBR 102 is composed by stacking $Al_{0.9}Ga_{0.1}As$ and $Al_{0.3}Ga_{0.7}As$ with a carrier concentration of $2\times10^{18}$ cm$^{-3}$ alternately 40 periods so that each film thickness becomes quarter of the wavelength of the medium. The active region 104 is comprised of an undoped $Al_{0.6}Ga_{0.4}As$ lower spacer layer, an undoped $Al_{0.11}Ga_{0.89}As$ quantum well layer, an undoped $Al_{0.3}Ga_{0.7}As$ barrier layer, and an undoped $Al_{0.6}Ga_{0.4}As$ upper spacer layer. The p-type upper DBR 106 is composed by stacking a p-type $Al_{0.9}Ga_{0.1}As$ layer and a p-type $Al_{0.3}Ga_{0.7}As$ layer with a carrier concentration of $3\times10^{18}$ cm$^{-3}$ alternately 24 periods so that each film thickness becomes quarter of the wavelength of the medium. The p-type GaAs contact layer 106A with a carrier concentration of $1\times10^{19}$ cm$^{-3}$ is formed at the top layer of the upper DBR 106, and a p-type AlAs layer is formed at the bottom of the upper DBR 106 or inside of the upper DBR 106. It is not illustrated, but a buffer layer may be provided between the substrate 100 and the lower DBR 102.

A resist pattern is formed on the contact layer 106A by the photolithography process conventionally known, and the annular p-side electrode 110 comprised of Au/Ti is formed on the contact layer 106A by the liftoff process. Then, SiON is deposited on whole surface of the substrate 100 by CVD, and the circular first insulating film 112 covering the beam window 110A which is the opening of the p-side electrode 110 is formed by patterning SiON. At this time, the inside of the p-side electrode 110 is covered by the first insulating film 112, and the outside is exposed. The beam window 110A is protected from an exposure and particles generated in subsequent processes by being covered by the first insulating film 112.

Figure 6B:
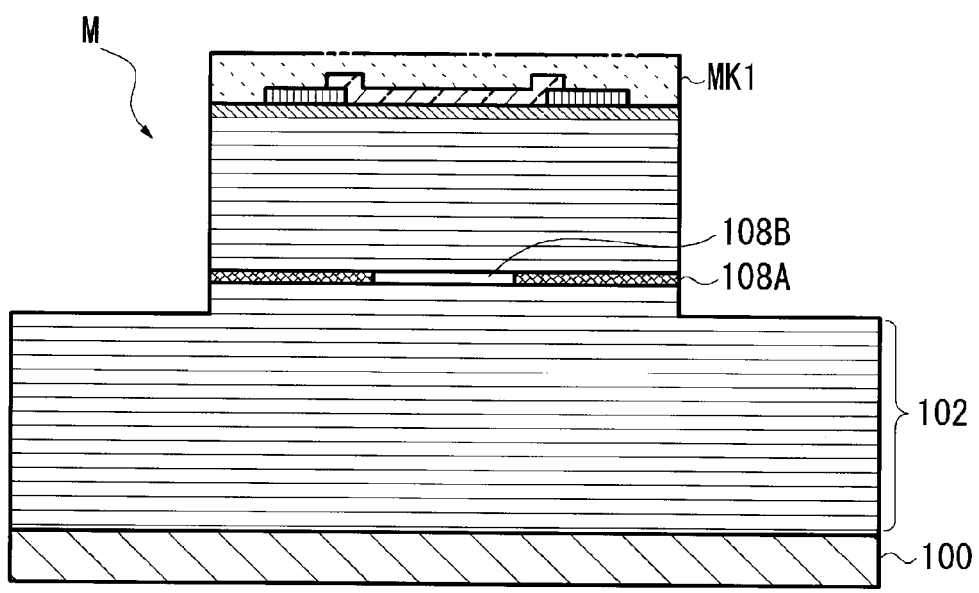

As illustrated FIG. 6B, a circular mask MK1 is formed on a region including the p-side electrode 110 and the first insulating film 112 by the photolithography process. Then, a cylindrical mesa M is formed by etching a semiconductor layer from the upper DBR 106 to the lower DBR 102 by the reactive ion etching process using boron trichloride for example. Accordingly, an AlAs layer 108 inside of the upper DBR 106 is exposed on the side surface of the mesa M. Then the oxidization process that exposes the substrate to the water-vapor atmosphere with a temperature of 340° C. for a given time is carried out, and the oxidization region 108A which is oxidized a certain distance from the side surface of the mesa M is formed inside of the AlAs layer 108. The oxidation control is performed so that a radius of plane field of the conductive region 108B surrounded by the oxidization region 108A becomes larger than the radius needed for a conventional single lateral mode (e.g. 3 μm), and becomes the size at which the high-order lateral mode occurs (e.g. 5 μm).

Figure 7A:
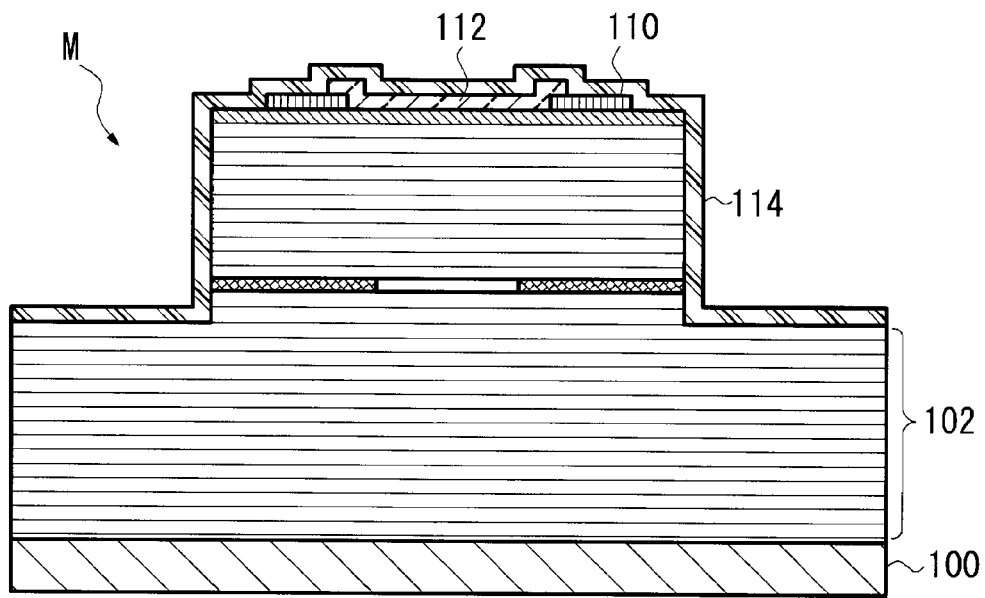
FIGS. 7A and 7B are cross-section views for explaining a fabrication process of a vertical cavity surface emitting laser in accordance with the third exemplary embodiment of the present invention.
Figure 7B:
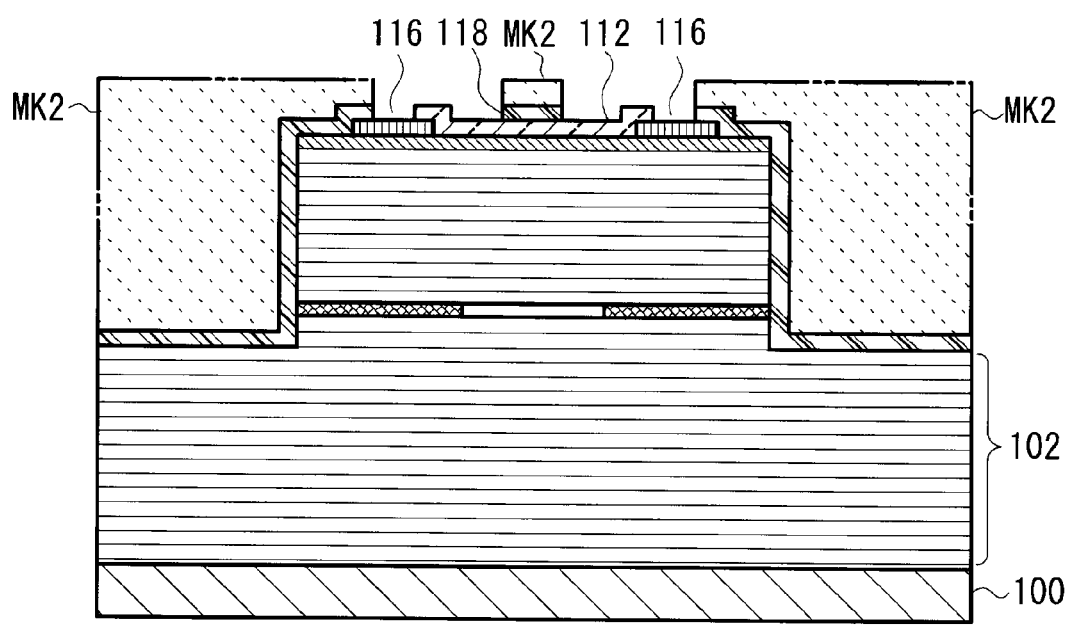

Then, the mask MK1 is removed, and the interlayer insulating film 114 comprised of SiN is formed on whole surface of the substrate as illustrated in FIG. 7A. The interlayer insulating film 114 is adjusted so that the film thickness of the top of the mesa M becomes quarter of the wavelength of the medium. Then, as illustrated in FIG. 7B, a mask MK2 is formed by the photolithography process, and the interlayer insulating film 114 exposed by the mask MK2 is removed by etching. Preferably, the interlayer insulating film 114 is etched under the etching condition that the selectivity between the interlayer insulating film 114 and the first insulating film 112 can be selected. For example, the reactive ion etching process using an etchant of $SF_6+O_2$ is carried out. According to this, patterns of the contact hole 116 and the second insulating film 118 to the p-side electrode 110 is formed at the top of the mesa M. Then, a metallic wiring that is coupled to the p-side electrode 110 through the contact hole 116 is formed, and the n-side electrode is formed on the back side of the substrate.

According to the fabrication method of the present exemplary embodiment, it is possible to form the second insulating film 118 with an easy process only changing a mask pattern by forming the second insulating film 118 and the interlayer insulating film 114 simultaneously, and mass production at low cost becomes possible. In addition, as the process is processed under the condition that the beam window 110A is protected by the first insulating film 112, this makes it work for the reliability of the VCSEL. When the insulating layer is formed inside of the contact layer by etching the contact layer, it is difficult to stop the etching with high accuracy. If the film thickness of the etched layer is not uniform, there is a possibility that a reflection ratio changes, and this makes it difficult to obtain a reproducible composition.

In above exemplary embodiments, a description was given of a current narrowing layer comprised of AlAs, but a current narrowing layer may be an AlGaAs layer of which the Al composition is higher than the Al composition of other DBRs. In addition, the radius of the conductive region (the oxidized aperture) of the current narrowing layer can be changed appropriately according to required optical output. Furthermore, in above exemplary embodiments, the description was given of an GaAs-based VCSEL, but the present invention can be applied to other VCSELs using other III-V group compound semiconductors. In above exemplary embodiments, the description was given of a single spot VCSEL, but the VCSEL can be a multi-spot VCSEL where multiple mesas (emission portion) are formed on the substrate, or a VCSEL array.

Figure 8A:
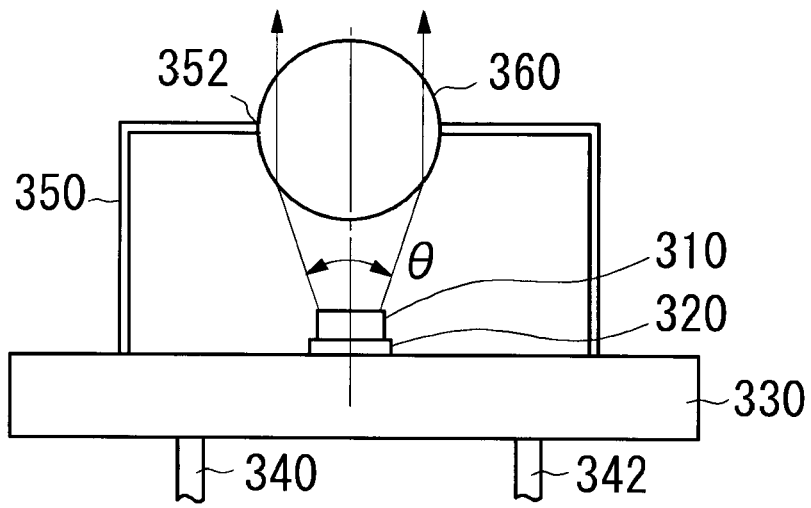
FIGS. 8A and 8B are schematic cross-section views illustrating a composition of a vertical cavity surface emitting laser device in which the vertical cavity surface emitting laser of exemplary embodiments and an optical component are packaged.

A description will be given of a vertical cavity surface emitting laser device, an optical information processing apparatus, and an optical transmission device using the VCSEL of exemplary embodiments with reference to drawings. FIG. 8A is a cross-section view illustrating a composition of a vertical cavity surface emitting laser device in which the VCSEL and an optical component are packaged. A vertical cavity surface emitting laser device 300 fixes a chip 310, on which a long resonator VCSEL is formed, to a disk-shaped metal stem 330 via a conductive bond 320. Conductive leads 340 and 342 are inserted in a through hole (not illustrated) provided to the stem 330, the lead 340 is electrically connected to the n-side electrode of the VCSEL, and the lead 342 is electrically connected to the p-side electrode.

A rectangular hollow cap 350 is fixed on the stem 330 including the chip 310, and a ball lens 360 is fixed in an opening 352 located in the center of the cap 350. The ball lens 360 is laid out so that the optical axis of the ball lens 360 corresponds to the substantial center of the chip 310. When a forward current is applied between leads 340 and 342, a laser beam is emitted from the chip 310 to the vertical direction. The distance between the chip 310 and the ball lens 360 is adjusted so that the ball lens 360 is included within the spread angle θ of the laser beam from the chip 310. A light receiving element and a temperature sensor to monitor the emitting condition of the VCSEL can be included in the cap.

Figure 8B:
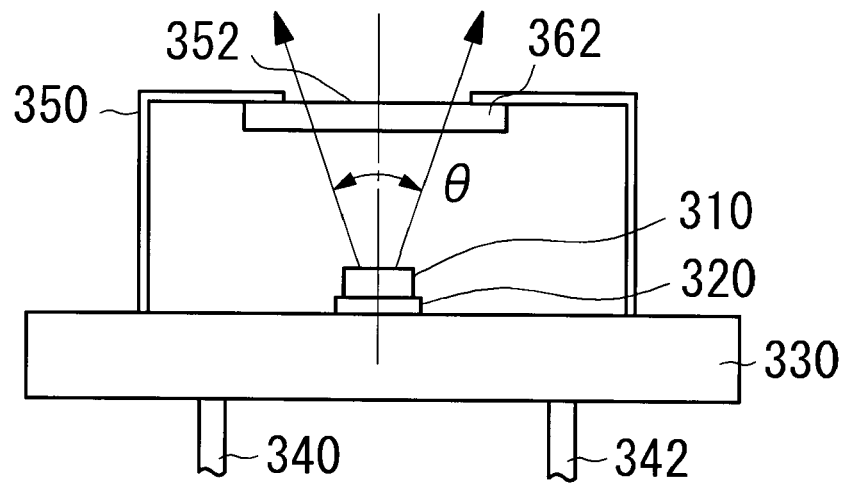

FIG. 8B is a diagram illustrating a composition of another vertical cavity surface emitting laser device. A vertical cavity surface emitting laser device 302 illustrated in FIG. 8B fixes a plane glass 362 in the opening 352 located in the center of the cap 350 instead of using the ball lens 360. The plane glass 362 is laid out so that the center of the plane glass 362 corresponds to the substantial center of the chip 310. The distance between the chip 310 and the plane glass 362 is adjusted so that the opening radius of the plane glass 362 becomes equal to or larger than the spread angle θ of the laser beam from the chip 310.

Figure 9:
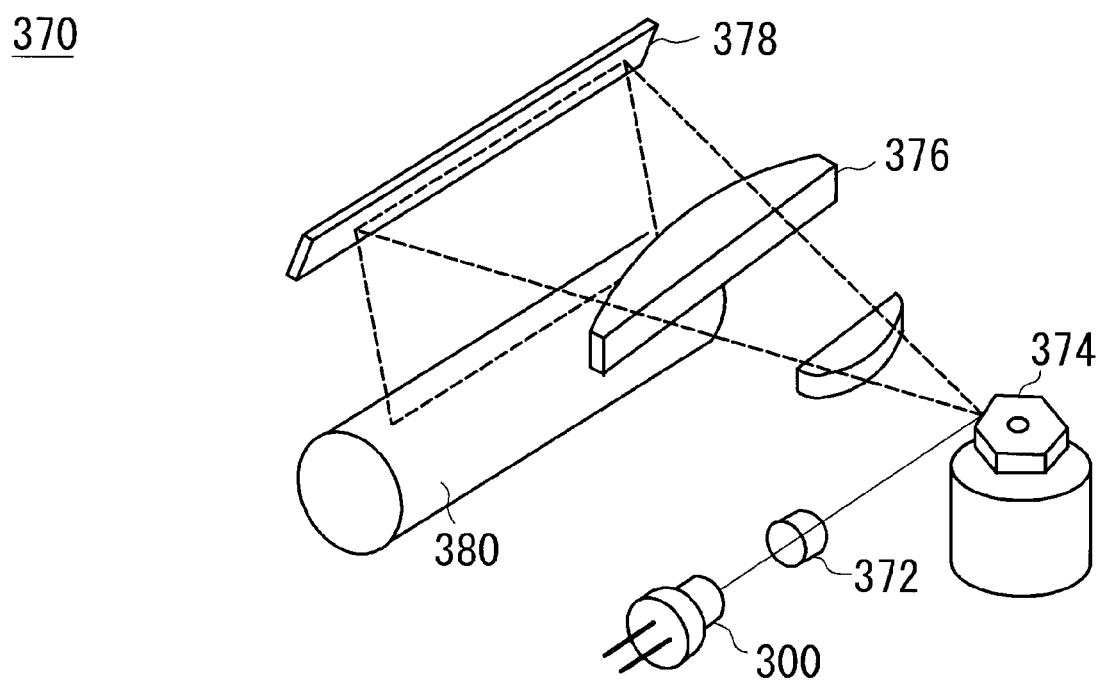
FIG. 9 is a diagram illustrating a composition of a light source device using the vertical cavity surface emitting laser of exemplary embodiments.

FIG. 9 is a diagram illustrating a case where the VCSEL is applied to a light source of an optical information processing apparatus. An optical information processing apparatus 370 is provided with a collimator lens 372 which receives the laser beam from the vertical cavity surface emitting laser device 300 or 302, in which the long resonator VCSEL is packaged, illustrated in FIG. 8A or 8B, a polygon mirror 374 which rotates at constant speed and reflects a beam of light from the collimator lens 372 at constant spread angle, a fθ lens 376 which receives the laser beam from the polygon mirror 374 and irradiates the laser beam to a reflection mirror 378, the linear reflection mirror 378, and a photoreceptor drum (a record medium) 380 which forms latent images based on the reflection beam from the reflection mirror 378. As described above, the laser beam from the VCSEL can be used as a light source of the optical information processing apparatus such as a copier and a printer provided with an optical system which focuses the laser beam from the VCSEL onto the photoreceptor drum and a structure which scans the focused laser beam on the photoreceptor drum.

Figure 10:
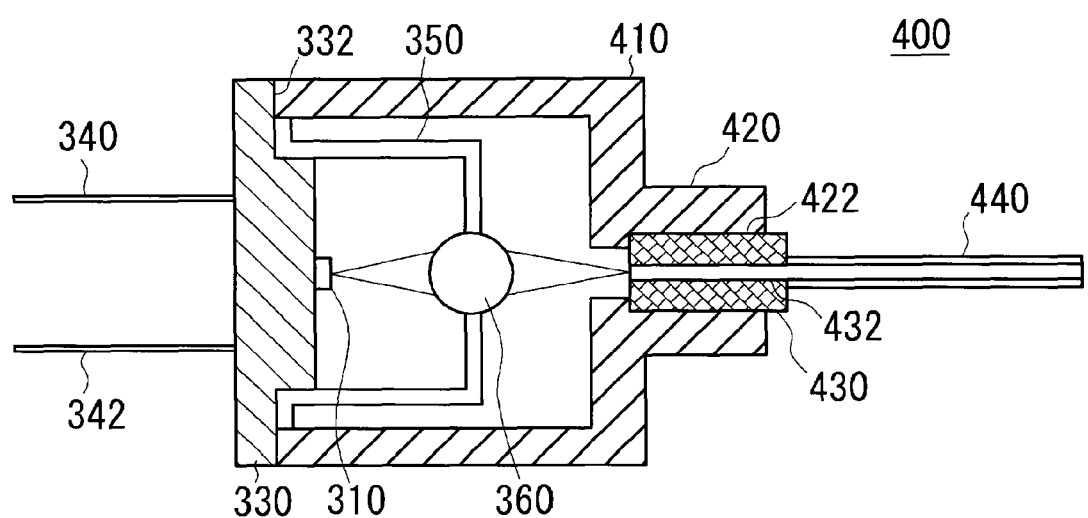
FIG. 10 is a schematic cross-section view illustrating a composition of an optical transmission device using the vertical cavity surface emitting laser device illustrated in FIG. 8A.

FIG. 10 is a cross-section view illustrating a composition where the vertical cavity surface emitting laser device illustrated in FIG. 8A is applied to an optical transmission device. An optical transmission device 400 includes a cylindrical chassis 410 fixed to the stem 330, a sleeve 420 integrally-formed on the end surface of the chassis 410, a ferrule 430 held in an opening 422 of the sleeve 420, and an optical fiber 440 held by the ferrule 430. The end portion of the chassis 410 is fixed to a flange 332 which is circumferentially-formed of the stem 330. The ferrule 430 is laid out in the opening 422 of the sleeve 420 accurately, and the optical axis of the optical fiber 440 is matched to the optical axis of the ball lens 360. The core of the optical fiber 440 is held in a through hole 432 of the ferrule 430.

The laser beam emitted from the surface of the chip 310 is focused by the ball lens 360. The focused beam enters to the core of the optical fiber 440, and is transmitted. In above exemplary embodiments, the ball lens 360 is used, but other lenses such as a biconvex lens and a plane-convex lens can be used besides a ball lens. Furthermore, the optical transmission device 400 can include a drive circuit to apply an electrical signal to leads 340 and 342. The optical transmission device 400 can also include a receiving function to receive an optical signal through the optical fiber 440.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A fabrication method of a vertical cavity surface emitting laser, the fabrication method comprising:
   preparing a substrate which includes a semiconductor layer, the semiconductor layer including a first semiconductor multilayer reflector of a first conductive type, an active region, a current narrowing layer which is conductive, and a second semiconductor multilayer reflector of a second conductive type;
   forming an electrode which defines a beam window on the second semiconductor multilayer reflector;
   forming a first insulating layer, which is comprised of a material having a first refractive index to an oscillation wavelength, to cover the beam window;
   after covering the beam window, forming an oxidization region and a conductive region surrounded by the oxidization region inside of a current narrowing layer by oxidizing the current narrowing layer; and
   forming, on the first insulating film, a pattern of a second insulating layer that substantially corresponds to a center of the conductive region and is smaller than a radius of the conductive region, the second insulating layer being comprised of a material having a second refractive index that is greater than the first refractive index.

2. The fabrication method according to claim 1, further comprising, forming a columnar structure including the electrode and the first insulating layer at a top on the substrate by etching the semiconductor layer from the second semiconductor multilayer reflector to the first semiconductor multilayer reflector, after forming the oxidization region, forming a third insulating layer which covers a side surface of the columnar structure, wherein the third insulating layer is comprised of a same material as that of the second insulating layer, and the second insulating layer and the third insulating layer are formed simultaneously.

3. The fabrication method according to claim 1 wherein a third refractive index to an oscillation wavelength of a semiconductor layer composing the second semiconductor multilayer reflector is greater than the second refractive index.

4. A fabrication method of a vertical cavity surface emitting laser having a columnar structure on a substrate, the fabrication method comprising:

stacking a semiconductor layer including a first semiconductor multilayer reflector of a first conductive type, an active region, a current narrowing layer which is conductive, a second semiconductor multilayer reflector of a second conductive type on the substrate;

forming an electrode which is annular and defines a beam window on the second semiconductor multilayer reflector;

forming a first insulating film that is comprised of a material having a first refractive index to an oscillation wavelength on the electrode to cover a beam window of the electrode;

forming the columnar structure including the electrode and the first insulating film at a top on the substrate by etching the semiconductor layer from the second semiconductor multilayer reflector to the first semiconductor multilayer reflector;

forming an oxidization region and a conductive region surrounded by the oxidization region inside of a current narrowing layer by oxidizing the current narrowing layer inside of the columnar structure selectively;

forming a second insulating film that is comprised of a material having a second refractive index that is greater than the first refractive index on whole area of the substrate including the columnar structure; and forming a pattern of the second insulating film that corresponds to a center of the conductive region and is smaller than a radius of the conductive region, and an opening that exposes the electrode on the first insulating film by removing the second insulating film at the top of the columnar structure selectively.

5. The fabrication method according to claim 4 wherein a third refractive index to an oscillation wavelength of a semiconductor layer composing the second semiconductor multilayer reflector is greater than the second refractive index.

* * * * *